United States Patent [19]
Buch et al.

[11] Patent Number: 5,550,839
[45] Date of Patent: Aug. 27, 1996

[54] MASK-PROGRAMMED INTEGRATED CIRCUITS HAVING TIMING AND LOGIC COMPATIBILITY TO USER-CONFIGURED LOGIC ARRAYS

[75] Inventors: Kiran B. Buch, Fremont; Edwin S. Law, Saratoga; Jakong J. Chu, Santa Clara, all of Calif.

[73] Assignee: Xilinx, Inc., San Jose, Calif.

[21] Appl. No.: 30,981

[22] Filed: Mar. 12, 1993

[51] Int. Cl.$^6$ .................................. G01R 31/28
[52] U.S. Cl. .................... 371/22.1; 364/491; 364/488; 395/921
[58] Field of Search ................... 364/488, 489, 364/490, 491; 371/22.1, 22.3, 22.6, 22.2; 395/920, 921, 923

[56] References Cited

U.S. PATENT DOCUMENTS

| | | | |
|---|---|---|---|
| 4,602,339 | 7/1986 | Aihara et al. | 364/490 |
| 4,799,004 | 1/1989 | Mori | 371/22.3 |
| 4,960,724 | 10/1990 | Watanabe et al. | 364/490 X |
| 5,068,603 | 11/1991 | Mahoney | 324/158 |
| 5,072,402 | 10/1991 | Ashtaputre et al. | 364/491 |
| 5,224,056 | 6/1993 | Chene et al. | 364/490 |
| 5,252,917 | 10/1993 | Kadowaki | 371/22.3 X |
| 5,343,406 | 8/1994 | Freeman et al | 364/490 |

OTHER PUBLICATIONS

Roth, J. P., "Diagnosis of Automata Failures: A Calculus and a Method," IBM J. Res. Develop., vol. 10, pp. 278–291, Jul. 1966.

*Primary Examiner*—Emanuel T. Voeltz
*Assistant Examiner*—M. Kemper
*Attorney, Agent, or Firm*—Edel M. Young; Norman R. Klivans

[57] ABSTRACT

Method and apparatus for producing mask-configured integrated circuits which are pin, logic, and timing compatible substitutes for user-configured logic arrays, without the need for logic or timing simulations of the mask-configured circuit design. Scan testing networks of test blocks and modified flip flops are included in the mask-configured substitutes to test functionality. Logic compatibility to the user-configured logic array (an FPGA) is preserved by clustering together in the mask-configured integrated circuit (a gate array) all of the logic gates which perform the functions of a particular FPGA logic block. Moreover, only those FPGA logic gates or functions which are used are replicated in the gate array, to conserve chip area. Test blocks are inserted in the gate array only where needed, i.e. at the output of any function generator that has connections external to the configurable logic block, and all flip flops are modified to also function as test blocks in a test mode. All logic blocks along asynchronous data paths in the FPGA are timing matched by delay elements in the mask-programmed substitute to preserve timing compatibility to the FPGA.

12 Claims, 6 Drawing Sheets

MASK-PROGRAMMED INTEGRATED CIRCUITS HAVING TIMING AND LOGIC COMPATIBILITY TO USER-CONFIGURED LOGIC ARRAYS

BACKGROUND OF THE INVENTION

1. Field of the Invention

The present invention relates to integrated circuits having arrays of digital logic gates, and more specifically to a structure and method for producing mask-interconnected integrated circuit substitutes for user-configured logic arrays.

2. Description of the Prior Art

U.S. Pat. No. 5,068,603 issued Nov. 26, 1991 to John E. Mahoney and assigned to Xilinx, Inc. (incorporated herein by reference) discloses (see Abstract) a particular structure and method for producing mask-configured integrated circuits which are pin compatible substitutes for user-configured logic arrays. Scan testing networks are formed in the mask-configured substitutes to test the operability of logical function blocks formed on such chips. What is variously called "hard-wired interconnection", "metal interconnection" or "mask-configured interconnection" for integrated circuit chips uses the fixed layout of various conductive paths in the integrated circuit that are either diffused in the substrate or patterned in metal layers on the substrate to interconnect input and output terminals of logic gates one to the next. The mask-configured interconnection is associated for instance with standard gate arrays.

This is in contrast to the alternate approach for interconnecting such logic gates described variously as "soft wiring", "soft configured interconnection" or "user-configured interconnection". This user-configured interconnection is associated with field programmable gate arrays (FPGA). The above-referenced patent discloses a method eliminating the need for simulation when transferring a particular logic design from a user-configured interconnection to a mask-configured interconnection, because functional compatibility is guaranteed by the absence of any logic transformation; a configurable logic block ("CLB") in the field programmable gate array is replicated by a group of logic gates in the gate array. (Various names are used by different FPGA vendors for the CLB. Altera calls it a Logic Array Block (LAB) in their FLEX family; AT&T calls it a Programmable Logic Cell (PLC) in their ORCA family.)

A logic block is a large number of predesigned logical gates of a particular configuration which is replicated in a number of such blocks on one chip. Xilinx logic blocks include one or two combinational function generators and one or two flip flops with programmable means for selecting the combinational function to be implemented and for routing signals into the logic block, to and from the function generators and flip flops and out of the logic block. The designation "configurable logic blocks" is used because the user may determine the configuration of the logic blocks in the FPGA. In the above-referenced patent, for synchronous paths, the timing compatibility of the gate array to the original FPGA is guaranteed by the timing of the logic blocks in the gate array being identical to that of the configurable logic blocks in the FPGA. All routing delays between logic gates are proportionally shorter in the gate array than in the FPGA. Thus, the gate array implements logic the same way the FPGA does. That is, the gate array essentially replaces the programmable elements (pass transistors) of the FPGA with metal contacts using a single masked-defined metallization layer. For some asynchronous paths, the gate array equivalent may be incompatible with the FPGA version, in which case the path and its logic elements must be redesigned before the gate array can be completed. For each and every CLB in the user-configured design (whether used or not) there exists a corresponding logic block in the mask-configured gate array circuit.

Additionally, the method of fabricating gate arrays described in the above-referenced patent provides 100% fault coverage by a test block associated with each (1) function generator in each logic block, and (2) with each flip-flop output in each logic block. This allows each function generator and flip-flop to be exhaustively tested in isolation. The test blocks are also referred to as a "scan chain".

In contrast, other prior art methods for substituting a mask-configured chip for a user-configurable chip map the circuit of the user-configurable chip design into the mask-configured chip design, so that the arrangement of circuit elements (logic gates) is substantially altered in the process. This typically requires several mask-configured metallization (interconnect) layers in the mask-configured chip. (Mapping is the process of taking an FPGA logic function and synthesizing it as an interconnection of logic gates such as NAND, NOR, INV etc. for a gate array.) These other prior art methods are more economical in use of chip real estate than is the approach of the above-referenced patent, but require logic and timing simulation of the mask-configured chip design to ensure functionality.

As has been recognized by the present inventors, the 100% replication of each FPGA logic gate in the approach of the above-referenced patent requires the use of extra real estate on the gate array, and so wastes gates in the gate array. This one-to-one match of CLB's (and also input/output blocks) of the FPGA to logic in the gate array takes place even though typical designs use anywhere from 60% to 100% of the logic blocks in the FPGA.

Similarly, the provision of 100% test block coverage in the above-referenced patent has been recognized by the present inventors as consuming substantial extra area on the gate array.

Additionally, the above-referenced patent requires a custom base integrated circuit gate array that is specially designed (at substantial expense) to be configured by a single interconnect layer and which is usable only with one member of an FPGA device family, and for which a new gate array must be provided for each new FPGA architecture.

Thus disadvantageously the method of the above-referenced patent requires excessive chip area in the mask-configured chip to replicate the functions in the user-configured design. A substantial cost saving would result if chip real estate could be reduced, by replacing the user-configured design with a gate array (mask-configured) design with a smaller number of gates than that of the gate array of the above-referenced patent. Further, it would be desirable to do so without the need for logic and timing simulation as in other prior art methods using mapping. Also, it would be advantageous to eliminate the need for a unique base gate array (configured by a single interconnect mask) for each member of an FPGA device family.

SUMMARY OF THE INVENTION

In accordance with the invention, a functioning user-configured chip design such as an FPGA is converted into a mask-configured chip architecture (such as a gate array)

while preserving logic and timing compatibility and without simulating the logic or timing of the mask-configured chip. This is accomplished by synthesizing only those CLBs in the FPGA which are actually in use, so as to map only the used CLBs into the mask-configured chip. All interconnections external to the CLBs which were used in the FPGA are preserved in the gate array.

Test blocks are provided in the mask-configured design only where needed. "Where needed" has been determined to be at the output of any function generator that has connections external to the CLB; also each flip-flop is modified to work as a test block, by providing multiplexed inputs to the flip-flops so that the flip-flops operate both in the normal mode and in a test mode. This advantageously substantially reduces the number of test blocks (and hence logic gates devoted to testing) on the mask-configured integrated circuit, while preserving the benefits of 100% fault coverage.

Each synthesized CLB from the user-configured design is placed and routed as a cluster of gates in the mask-configured chip in order to maintain physical proximity and thereby maintain timing equivalence to that in the user-configured chip; however, typically the cluster of gates does not correspond one-to-one to the gates in the corresponding FPGA CLB, due to the omission in the mask-configured chip of unused FPGA gates. Although physical proximity does not guarantee timing equivalence, it prevents excessive routing delay within the synthesized CLB. Thus, physical proximity assures that the timing specification of the synthesized CLB is equal to or better (faster) than the corresponding FPGA CLB specification.

Also in order to maintain timing compatibility, all CLBs along asynchronous paths in the user-configured design are timing matched in the mask-configured design by insertion of additional logic to maintain timing compatibility.

This process is applicable to gate arrays having a sea of gates architecture and those having a channeled architecture. Additionally, the method is general and not limited specifically to FPGAs and gate arrays, but applicable to any mask-configured logic cell integrated circuit chip based on a user-configured design.

Advantageously by eliminating unused logic blocks and minimizing the amount of test block circuitry in the mask-configured chip, a mask-configured chip having a relatively small number of gates is substituted for a user-configured chip having a much larger number of gates. The resulting area saving economizes in the manufacture of the mask-configured chip.

Maintaining both logic and timing compatibility minimizes the risk of error when converting a particular user-configured chip design to a mask-configured chip, and reduces the elapsed time for such conversion. Thereby the advantages of the existing functioning design in the user-configured chip are preserved and carried over to the mask-configured chip, avoiding logic redesign. Thus advantageously the conversion may be performed largely automatically (for instance by computer programs) with minimum human intervention.

DETAILED DESCRIPTION OF THE INVENTION

Figure 1A:
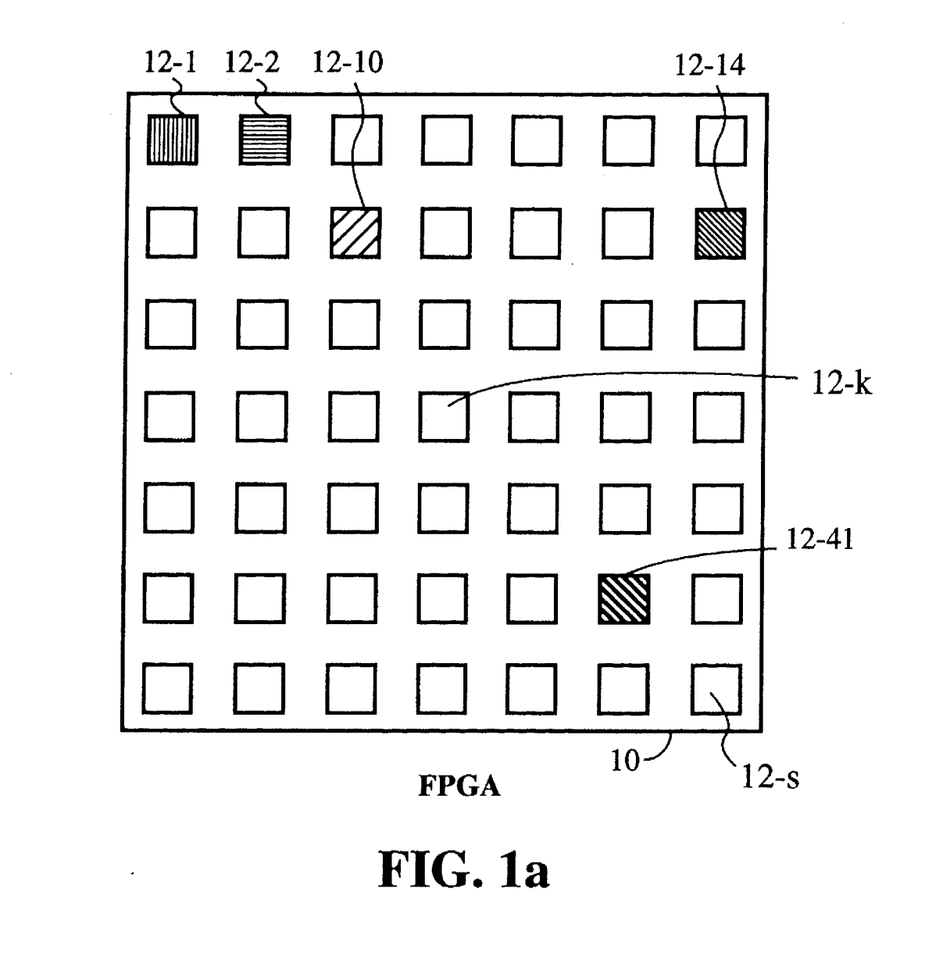
FIGS. 1a and 1b show conceptually the substitution of a gate array for a FPGA.
Figure 1B:
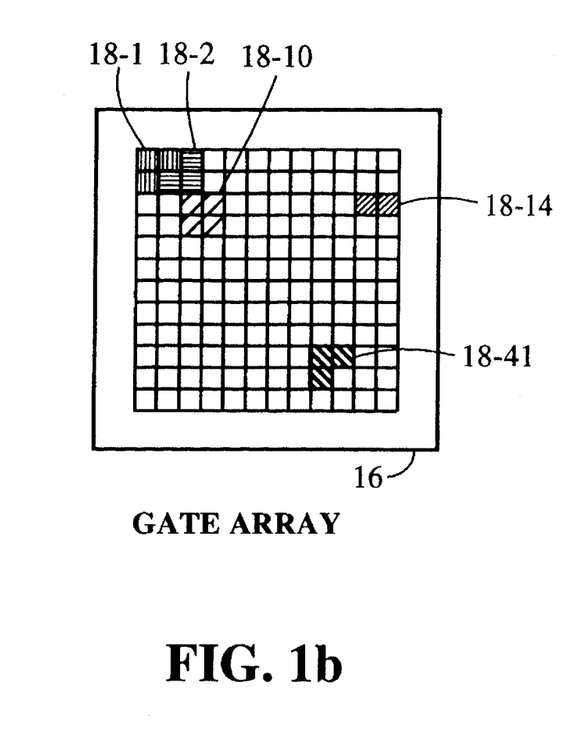

FIGS. 1a and 1b show gate clustering in accordance with the invention. FIG. 1a shows graphically FPGA 10 in top view including a plurality of CLBs 12-1, 12-2, 12-3, . . . 12-k, 12-s arranged in rows and columns. The functionality of FPGA 10 is replicated in FIG. 1b in a gate array mask-configured integrated circuit 16. As shown this is a "sea of gates" array, but could be a channelled gate array. Each CLB of FPGA 10 FIG. 1a which is in use (connected) has a corresponding set of functionally identical gates in gate array 16 of FIG. 1b. As shown by the various types of hatching, each particular used CLB in FPGA 10 corresponds to a clustered group of gates in gate array 16. For instance, the CLB 12-1 in FPGA 10 corresponds to the identical logic function found in the cluster of similarly hatched gates designated 18-1 in gate array 16. Similarly, CLB 12-41 in FPGA 10 has the logic function found in the cluster of gates designated 18-41 in gate array 16. As noted above, only those CLBs of FPGA 10 which are used, i.e. interconnected to other CLBs, are mapped (have corresponding logic gate clusters) into gate array 16.

Figure 2A:
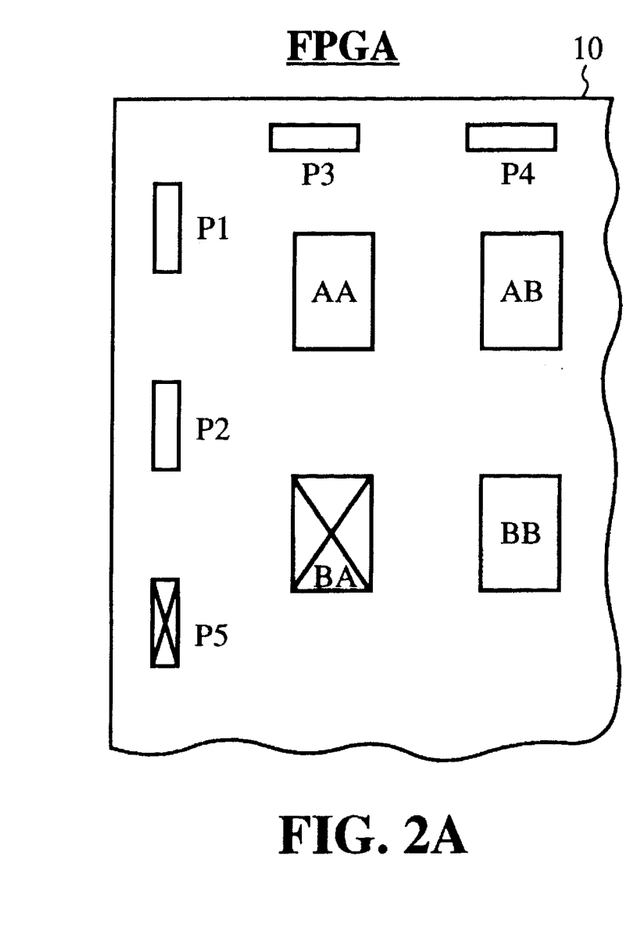
FIG. 2a shows an upper left hand corner portion of a FPGA.
Figure 2B:
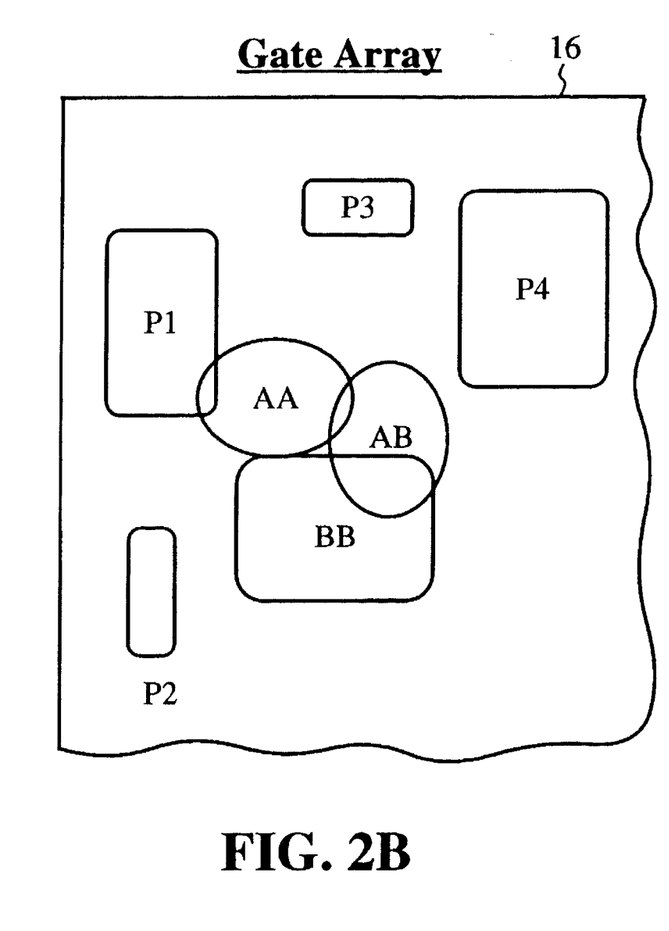
FIG. 2b shows an equivalent portion of a gate array.

This mapping also shows (in a different representation) in FIGS. 2a and 2b respectively a portion of FPGA 10 and of gate array 16. A portion of FPGA 10 (in this case the upper left-hand portion) includes input/output blocks (IOBs) P1, P2, P3, P4 and P5. It is to be understood that these IOBs include not just the actual input/output pads but may also include associated logic circuitry such as flip-flops and drivers. In this case P5 is an unused IOB, i.e. is not connected as shown by the X in its interior. Also shown in FPGA 10 are CLB AA, AB, BB, and BA. Again, CLB BA is not used as designated by the X in its interior. This means CLB BA is not interconnected to any other elements of FPGA 10.

Gate array 16 corresponds logically (in terms of its functioning) to FPGA 10, and therefore has clusters of gates which correspond to each IOB and CLB of FPGA 10. Thus gate array 16 has gate clusters representing IOBs P1, P2, P3 and P4. In gate array 16 these gate clusters are not of uniform physical size or shape, but are of varying sizes and shapes depending on the actual number of logic gates included. Also shown in the interior portion of gate array 16 are clusters of gates corresponding to CLBs AA, AB, and BB. There are no gate clusters in gate array 16 corresponding to IOB P5 or CLB BA of FPGA 10, because these two elements are not used in FPGA 10 (are not interconnected to any other elements) and therefore need not be present in gate array 16 to provide all of the logic functionality of FPGA 10. This illustrates an advantage of the present invention, which is the saving of chip real estate in gate array 16 by not devoting any gates to unused IOB P5 or CLB BA.

Figure 3A:
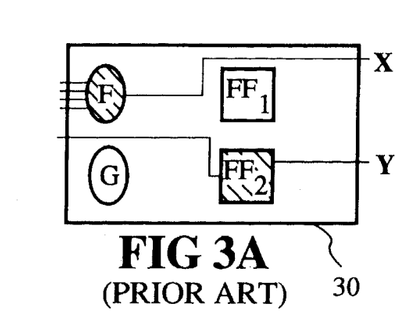
FIGS. 3a, 3b and 3c show three examples of prior art user-configured integrated circuits.
Figure 3B:
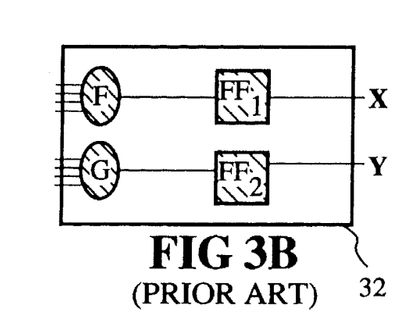
Figure 3C:
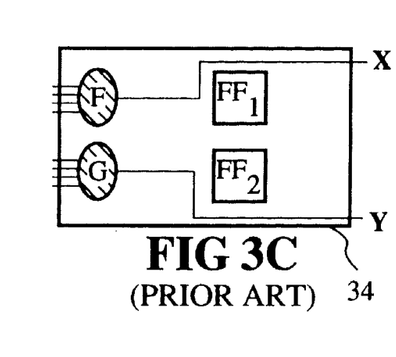

Another feature in accordance with the invention is illustrated in FIGS. 3a, 3b, 3c and corresponding FIGS. 4a, 4b, 4c, 5a, 5b, 5c. (FIG. 3a corresponds to 4a and 5a; FIG. 3b corresponds to 4b and 5b, and FIG. 3c corresponds to 4c and 5c.) FIGS. 3a, 3b and 3c are three schematic examples of one CLB of user-configured integrated circuits, i.e. FPGAs. FIG. 3a illustrates a CLB of a first FPGA 30, FIG. 3b illustrates a CLB of a second FPGA 32 and FIG. 3c illustrates a CLB of a third FPGA 34. (These are highly simplified to illustrate only the test block configuration.) The CLBs of FIGS. 3a, 3b, 3c do not include test blocks. Thus, in FPGA 30 function generator F provides output X to outside of this particular CLB. A "function generator" is defined as a collection of logic gates forming a look-up table that implements a specific logic function. Flip flop $FF_1$ is not connected and therefore is not shaded in FPGA 30 (the shaded elements are used and the unshaded elements are not used). Thus, function generator G is not used but flip flop $FF_2$ (which is used) provides output Y.

Figure 4A:
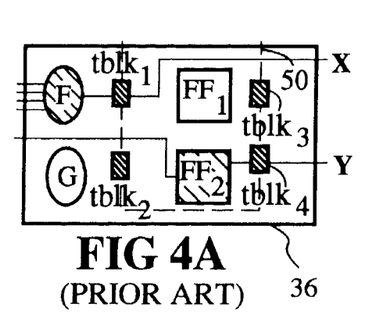
FIGS. 4a, 4b and 4c show three examples of prior art mask-configured integrated circuits.
Figure 4B:
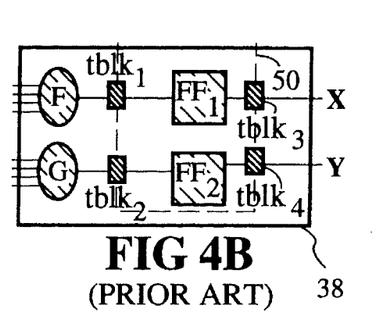
Figure 4C:
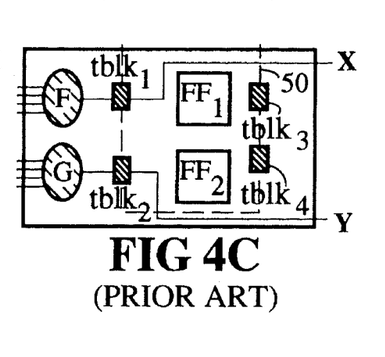

FIGS. 4a, 4b, 4c each show a CLB of a mask-configured chip equivalent in logic function to that respectively of FIGS. 3a, 3b, 3c as made in accordance with the prior art of the above-referenced patent. Here, the test blocks tblk are included with one test block associated with each element. Thus, in each CLB, test block $tblk_1$ is associated with function generator F, test block $tblk_2$ is associated with function generator G, test block $tblk_3$ is associated with flip flop $FF_1$ and test block $tblk_4$ is associated with flip flop $FF_2$. Also shown is test path 50 for interconnecting (chaining) each of the test blocks (scan chains). In the case of gate array 36 of FIG. 4a, since flip flop $FF_1$ is not used, test block $tblk_3$ is used only as a link in the test chain and hence is otherwise surplus. Similarly test block $tblk_2$ associated with unused function generator G in FPGA 36 is used only as a link in the test chain and hence is otherwise surplus. Thus, prior art gate array 36 includes substantial chip area devoted to unused flip flop $FF_1$, unused test block $tblk_3$, unused function generator G, and unused test block $tblk_2$. The output of test block $tblk_4$ from flip flop $FF_2$ is output Y.

Similarly, FIGS. 3b and 3c show respectively CLB's of FPGAs 32 and 34 as in the prior art and connected as shown. As can be seen, all elements F, G, $FF_1$ and $FF_2$ are in use in FPGA 32 of FIG. 3b. In contrast, in the third example of FIG. 3c of FPGA 34, flip flops $FF_1$ and $FF_2$ are not used in producing outputs respectively X and Y.

The gate array 38 of FIG. 4b corresponds in logic functionality to FPGA 32 of FIG. 3b.

Similarly, gate array 40 of FIG. 4c corresponds in logic functionality to FPGA 34 of FIG. 3c.

Figure 5A:
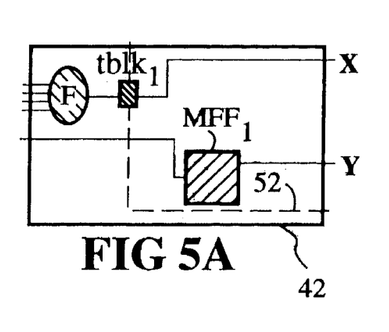
FIGS. 5a, 5b and 5c show three examples of mask-configured integrated circuits in accordance with the present invention.
Figure 5B:
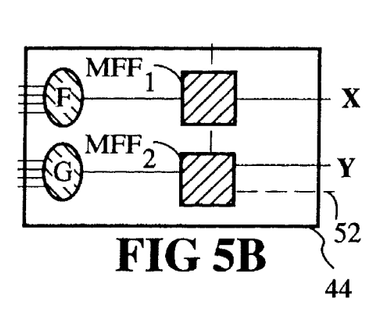
Figure 5C:
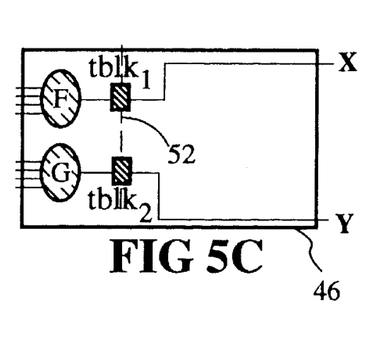

FIGS. 5a, 5b, and 5c show respectively gate arrays 42, 44, and 46 which correspond in their logic functionality to respectively FPGA 30 and gate array 36, FPGA 32 and gate array 38, and FPGA 34 and gate array 40. As can be seen in FIG. 5a in accordance with the invention, function generator G (which was not used in the CLB of FPGA 30 or gate array 36) is not present. This represents a savings in chip area which may be devoted to some other function. Similarly, flip flop $FF_1$ present in both FPGA 30 and gate array 36 is not present in gate array 42. For additional reduction in chip area, test block TB4 which was present in gate array 36 has been eliminated in gate array 42, where instead modified flip flop $MFF_1$ combines flip flop $FF_2$ and test block $tblk_4$ of gate array 36. As described above, modified flip flop $MFF_1$ includes a multiplexer respectively MD, MC on each of its data and clock input lines. These multiplexers allow multiple inputs to these terminals, with one set of inputs being for the normal operating mode and a second set of inputs being for the test mode. Thus, modified flip flop $MFF_1$ in effect includes the test functions of test block $tblk_4$ of gate array 36, with a significant reduction in chip area. As shown in the normal mode, modified flip flop $MFF_1$ produces output X identically to the equivalent structure in gate array 36.

Test blocks $tblk_1$ and $tblk_4$ of gate array 38 have been eliminated in gate array 44, because the function generators F and G have no direct connection outside the CLB (and are used to provide input to the associated flip flop inside the CLB). Similarly, FIGS. 5b and 5c show respectively gate arrays 44 and 46 corresponding in logic functionality to gate arrays 38 and 40. Again, in place of the combination of a flip flop and a test block, gate array 44 instead has modified flip flops $MFF_1$ and $MFF_2$. As shown in FIG. 5c for gate array 46, test blocks $tblk_3$ and $tblk_4$ have been eliminated along with flip flops $FF_1$ and $FF_2$ of gate array 40 in order to save chip area, since these elements were not used in FPGA 34. Also present in each of gate arrays 42, 44, and 46 is a test block interconnection 52 connecting the test blocks and the modified flip flops in each gate array as shown.

Thus in accordance with the invention, logic simulation of a gate array which is based on a working FPGA design is not needed, since the one-to-one mapping of the used CLBs of the FPGA to the gate clusters of the gate array ensures that all logic is replicated faithfully, and the netlist of interconnections between CLB's of the FPGA is the same as the interconnection between gate clusters of the gate array. Thus there is no need to verify the functionality of the gate array design so long as there is confidence that the original FPGA (user-configured) design was a properly functional circuit.

Also, the presence of the test blocks and testable modified flip flops in, for instance, gate array 42 allows testing in isolation of each of these elements (as in the above-referenced patent). Since each element typically only has approximately 4 or 5 inputs, it is possible to test each element via the test blocks or modified flip flop multiplexers by $2^4$ or $2^5$ test vectors (16 or 32 test vectors) which is relatively easily accomplished. Thus testing in isolation of elements of the gate array is accomplished by a simple test vector generation program.

A second element in verifying the correctness of the gate array substitute for the FPGA is timing correctness. As in the above-referenced patent, timing correctness for synchronous paths through the gate array is accomplished by ensuring that the transmission delays (cycle times) between sequentially connected gate array flip flops is less than or equal to that in the FPGA design. Thus, as long as data may be transmitted from one register to a succeeding register within the prescribed cycle time, the timing constraint for the synchronous logic paths is met and it is ensured that the functionality of the synchronous logic paths will be that of the equivalent FPGA, which has been previously ascertained to be working properly. It is also possible in accordance with the invention for the cycle time of the gate array to be faster than that of the equivalent FPGA, since for the synchronous portions of the circuit being faster merely buys additional slack time for transit of data between serially connected registers.

Figure 6:
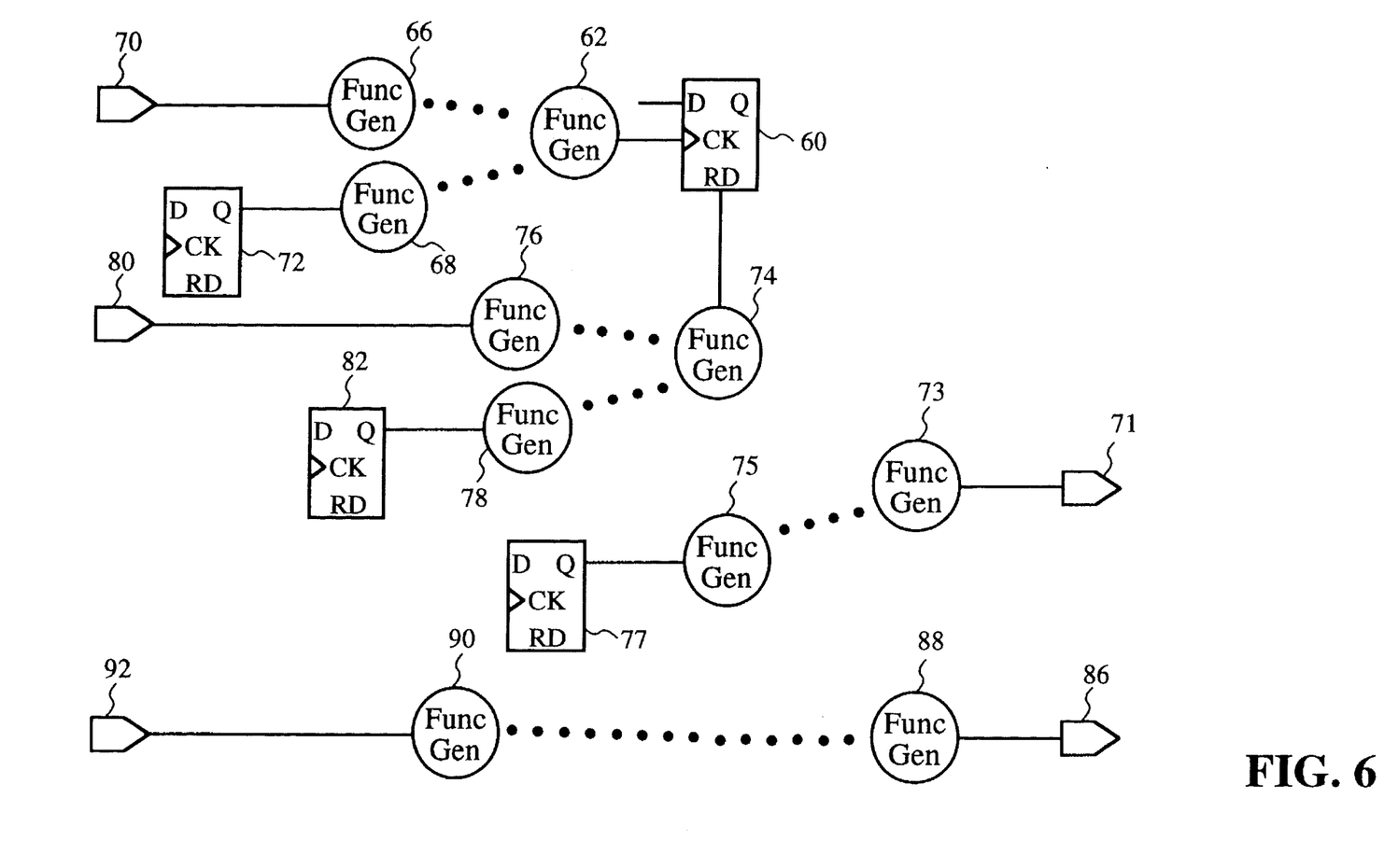
FIG. 6 shows a back tracking process to identify function generators along asynchronous paths of an integrated circuit in accordance with the invention.

More problematic are the asynchronous data paths in the gate array, for which in accordance with the invention a timing matching process is performed to ensure that the timing of these portions of the mask-configured circuit is compatible with that of the equivalent user-configured circuit. Thus, all logic blocks along the asynchronous paths of the gate array are timing matched. The timing matching process as illustrated in FIG. 6 back tracks to identify and mark all function generators along each asynchronous path in the FPGA. These function generators are synthesized for replication in the gate array with a timing constraint equal to the corresponding speed grade of the FPGA.

The back tracking includes identifying a first flip flop 60, the clock signal input of which comes from a function generator. A function generator is that portion of a CLB that can implement any logic function of for instance 4 or 5 variables (inputs) using a look-up table. (A typical CLB includes two identical function generators and two flip flops.) Then the input signals which drive function generator 62 are traced back along the dotted paths (indicating other non-illustrated function generators) to function generators 66 and 68, which in turn are driven respectively by a signal from an external input pin 70 and a flip flop 72. A similar back tracking process is applied to the reset or preset inputs of the flip flops. Similarly, the reset terminal (RD) of flip flop 60 which is driven by the output of function generator 74 is back tracked to function generators 76, 78 which in turn are driven by respectively external input pin 80 and flip flop 82.

The lower portion of FIG. 6 illustrates back tracking from external output pin 71 to function generator 73, and then via other function generators (dotted line) to function generator 75 and connected flip flop 77. The lower part of FIG. 6 illustrates back tracking from external output pin 86 to connected function generator 88 and then via intervening function generators (dotted line) to function generator 90 which receives input from external input pin 92.

Thus a timing match computer program automatically back tracks from each reset or preset flip flop terminal and each clock input terminal and each external output pin until encountering a signal source that is either a flip flop or an external pin. Timing constraints are then generated so that when the translation from the FPGA to the gate array design takes place, the delay through the logic path is matched to the original delay by means of added logic. The added logic is typically a string of delay buffers (e.g., inverter pairs) that only adds delays to the path. Other forms of delay are an increase in the number or size of gates. These are determined (see below) by the Design Compiler. Since each CLB in the FPGA is identical, each will have identical timing from input to output and that timing is preserved from input to output in the timing delay in the equivalent gate array logic clusters.

Figure 7:
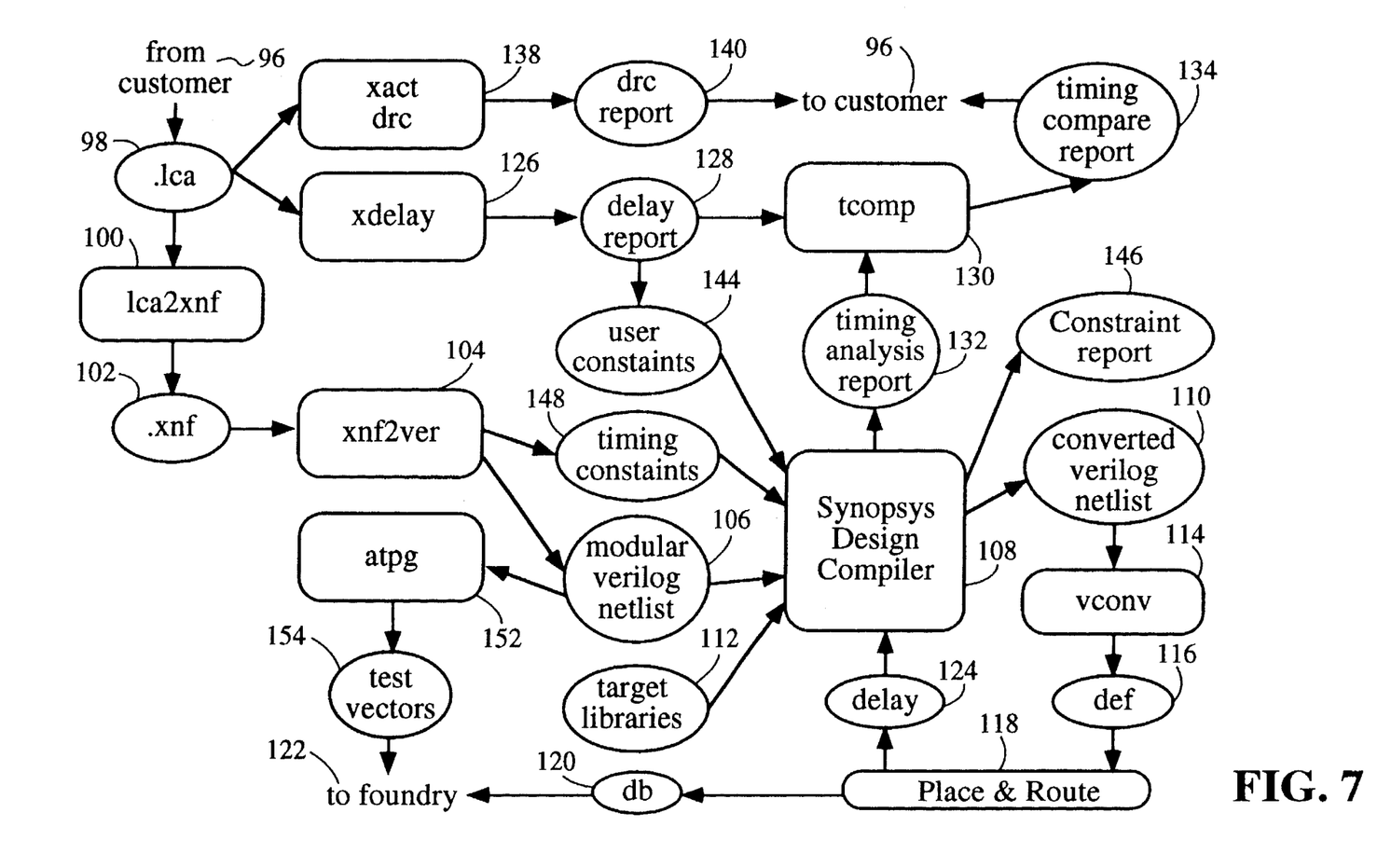
FIG. 7 is a flow chart showing converting a user-configured logic design to a mask-configured logic design in accordance with the invention.

FIG. 7 shows an overall process in accordance with the invention for conversion of an FPGA (user-configured) integrated circuit design to a gate array (mask-configured integrated circuit). Beginning at step 96, the "customer" (the FPGA designer) provides the .lca file 98 which is the FPGA netlist. (In FIG. 7, ellipses denote files or reports (data) and blocks denote computer programs for processing the data.) The .lca file 98 conventionally includes placement and routing information for the FPGA, which has already been ascertained to be functioning.

The .lca file 98 is converted by program lca2xnf 100 which reformats the .lca file 98 by stripping off the placement and physical routing information and leaving only the logic and timing information, embodied in file .xnf 102. (Programs lca2xnf 100, XACT® drc 128, and xdelay 126 are commercially available from Xilinx, Inc.) The goal is to extract the logic level connection information which will be ultimately converted into the gate array netlist.

Then program xnf2ver 104 converts file .xnf 102 to the modular Verilog netlist 106. (Verilog is an industry standard netlist data format.) Program xnf2ver 104 also performs test block insertion in accordance with FIGS. 5a, 5b, 5c. Program xnf2ver 104 converts CLB function generators to the equations which they implement, explicitly maps the CLB flip-flops and inserts test logic blocks (tblks) which were not needed in the user-configured circuit. This program applies the timing match process for asynchronous paths and generates the timing constraint file 148 used by the Synopsys Design Compiler 108. The input to xnf2ver 104 is the .xnf file 102 which is a Xilinx format netlist file describing a reprogrammable circuit, such as an FPGA.

One output of xnf2ver 104 is the modular verilog netlist file 106 (in standard format which can be read by the Design Compiler 108) describing a user-configured gate array. A second output is the timing constraints file 148 for the Design Compiler 108 to indicate (by a compiler script set of commands) the needed amount of delay for each asynchronous path. A third output is the name cross reference file (for use by the tcomp program 130 and not shown).

Options for xnf2ver are:

globalreset=true/false keep_tbuf=true/false

These options are entered manually when converting the original .lca file 98. The "global reset" option refers to use of an external global reset pin present in for instance a Xilinx chip. If not used, the circuitry for connecting this pin need not be provided in the mask-configured circuit. The "keep_tbuf" option relates to the method used for mapping internal tri-state busses.

The functionality of xnf2ver is:

1. Call .xnf file reader function to load .xnf file 102 into memory.
2. Determine whether a Xilinx XC3000 or an XC4000 design (these are two types of FPGA's) is being processed.
3. Modify data structures held in memory as follows:

a. Convert an oscillator (if used) to the appropriate circuit. If an internal oscillator such as present in the XC4000 FPGA chip has been used, this function is replaced with the circuitry of an oscillator in the gate array.

b. Process IOB storage elements (flip-flop, latch) and convert them to appropriate I/O pad and flip-flop/latch circuits.

c. Combine input buffers and 3-state output buffers to form a bidirectional buffers wherever a pin is used for both input and output.

d. Handle internal tri-state buffers (If keep_tbuf is true in the command option, tri-state buffers are preserved and a bus-latch added to remember the previous state. If keep_tbuf is false, tri-state buffers are converted to multiplexers).

e. If globalreset is false in the command option, delete the global reset pin from flip flops. Otherwise create the globalreset signal and the input buffer f. Convert wired-ANDs available in the XC4000 FPGA to equivalent AND gates for the gate array.

g. Analyze flip flops with respect to reset/preset, clock-enable, global reset/preset usage, generating simplified flip flops when these functions are not used. Rename flip flops to DFR1 . . . 8 or DFS1 . . . 8, (which are temporary names which will be replaced as stated below).

h. In order to be compatible with the Design Compiler 108 naming conventions, take out special characters in net names and instance names and report all such name changes in the cross-reference file.

i. After analyzing the function generator outputs in a CLB, insert test block circuitry description. Convert temporary names DFR1..8 and DFS1..8 to the corresponding MFF (a flip flop circuit modified to include the scan test circuit). Create the test block scan chain.

j. Identify CLBs configured as RAM (random access memory) in the FPGA and replace in the gate array with a RAM block of correct size.

k. Add time constraints for asynchronous nets to timing constraints (design compiler script) file 148.

4. Output the Verilog netlist file 106 with a top level module defining interconnections between submodules and with every CLB written out as a submodule.

Then Design Compiler 108 (commercially available from Synopsys) takes the data from the modular Verilog netlist 106, compiles the data in accordance with the timing constraints file 148, and outputs the converted Verilog netlist 110, in which each CLB from .lca file 98 is written out as a separate module; there is also a top level module for the interconnect between the CLBs. The target libraries 112 are files also provided to the design compiler 108, and describe the physical gate array chip which the gate array foundry will ultimately fabricate, i.e. each target library is associated with a particular target gate array architecture. Thus the overall process is generic to different gate arrays and foundries. This makes sure that the output from the Design Compiler 108 (the converted netlist 110) is directed to the target library 112 gate structure.

Program vconv 114 generates a netlist def file 116 for place and route purposes, containing commands to perform "clustered" placement. The input is the converted Verilog netlist file 110, and a user parameter file defining I/O pin assignments (not shown). The output is the Cadence def file 116, a library instance file (not shown), and a report file (not shown).

The functional steps of program vconv 114 are:

a. Read converted Verilog netlist 110 into memory data structures.

b. Output place and route netlist def file 116 in the component based format.

c. Output 'group' commands specifying instance names of gates to be clustered.

d. Create a library instance "lef" file consisting of the library elements used by the design (this is a subset of the gate array library file) prior to running place and route program 118. (Place and route program 118 is a commercially available program called Gate Ensemble from Cadence Design Systems.)

Each CLB of the FPGA supplied by the customer 96 and described in the .lca file 98 is compiled separately by the Design Compiler 108, so that each CLB is maintained as a unit during the process flow of FIG. 7.

The converted Verilog netlist 110 is modular (it is a single file that contains individual modules for each of the CLBs and a top level module). The def file 116 is the netlist for place and route system 118, where for instance names of gates that form a CLB are specially assigned (e.g. all elements that constitute CLB AA might have names that start with AA_) and commands to form clusters of gates (e.g. all gates with name AA_*) are put in by vconv program 114.

Place and route program 118 performs the actual placement and routing of the gate array, and the output from place and route program 118 is the data base file db 120 provided to the gate array foundry (fabrication facility) 122 and which is used to fabricate the interconnection layer mask(s) for the gate array. Thus, the foundry fabricates (interconnect) the gate array in accordance with file db 120, and tests the gate array using test vectors file 154 (described below).

Another output from place and route program 118 is the delay file 124 which represents additional delay due to wiring on the mask configured gate array. This data is used to back annotate the gate array netlist with actual delay values, and the timing analysis is performed by the Design Compiler 108, and a timing analysis report 132 produced. Program xdelay 126 produces a similar timing analysis report 128 for the original FPGA design. Program tcomp 130 compares the timing reports 132 and 128 and produces the timing comparison report 134 which is given to the customer 96 to allow him the opportunity to evaluate the impact of timing changes for asynchronous paths on the design. For synchronous paths, the timing analyzer of design compiler 108 performs the set up and hold checks.

Program tcomp 130 compares timing delay information between xdelay report 128 (relating to the FPGA) and the timing report 132 (relating to the converted gate array) generated by design compiler 108. The input is xdelay delay report 128, timing report 132, and the name cross reference file (not shown). The output is the timing comparison report file 134. The functional steps of program tcomp 130 are:

1. Read the two timing report files 128, 132 into memory.

2. For every path contained in the delay report file 128, perform the comparison with the path delay as reported by the timing analysis report 132.

3. Report the increase/decrease in delay in report 134.

Program XACT drc 138 is a design rule checker which analyzes the FPGA topology (from the .lca file 98) to find the s asynchronous data paths. The drc report 140 provided by program XACT drc 138 is for use by the customer to allow him to find asynchronous logic paths in his design. If these paths are determined to be problematic, the customer may choose to redesign a part of the circuit.

Also involved in the timing issue is user constraints file 144 which provides commands to Design Compiler 108 pertaining to timing matching to the original FPGA design. User constraints file 144 is the result of checking of each logic path including a gated clock signal, a gated reset signal, or an output pin.

Program atpg 152 automatically generates test vectors to provide 100% fault coverage. The input to this program is the modular Verilog netlist 106; the output is test vectors file 154. The functional steps of program atpg 152 are:

1. Perform exhaustive testing of every module by applying all possible combinations of inputs, observing the output, and checking against the expected output.

2. Format the test vectors file 154 for the target gate array tester equipment (not shown).

In one embodiment, computer programs xnf2ver 104, atpg 105, vconv 114 and tcomp of FIG. 7 are written in the C language. Alternatively, these computer programs may be written by one of ordinary skill in the art, and given the above description, may be written in various languages and in various forms to achieve the above described functionality.

Figure 8A:
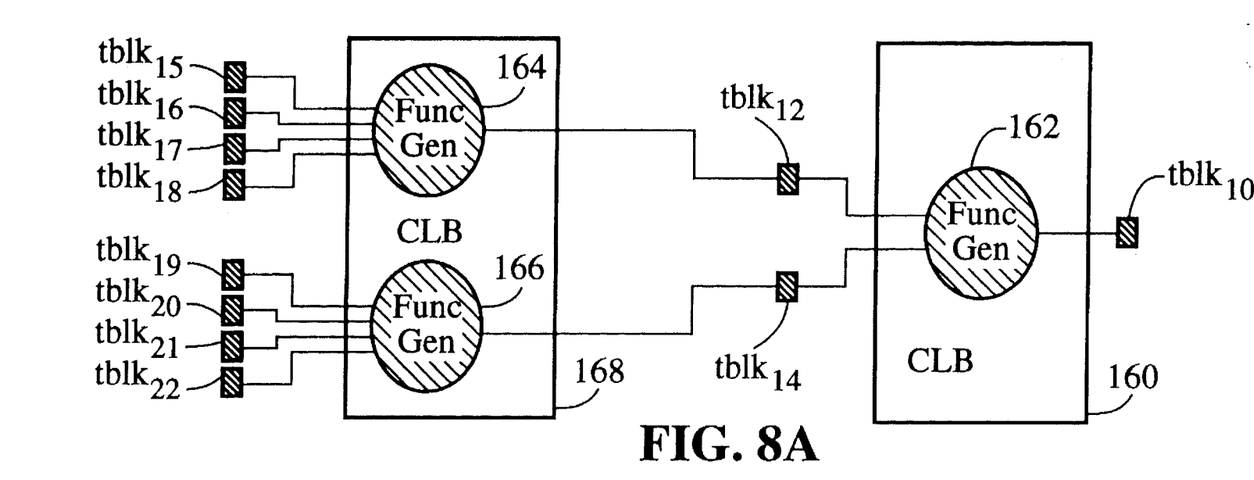
FIGS. 8a, 8b show use of test blocks in accordance with the invention.

FIG. 8a shows insertion of test blocks in the gate array by the above described method. A test block is connected to the output of each function generator, so that CLB 160 which includes function generator 162 is connected to test block $tblk_{10}$. Similarly, function generators 164, 166 of CLB 168 are connected respectively to test blocks $tblk_{12}$, $tblk_{14}$. In this case each function generator 164, 166 has 4 inputs (from other function generators) connected via test blocks $tblk_{15}$, ..., $tblk_{22}$. Thus test vectors provide all possible combinations of inputs to every function generator, testing one function generator at a time and providing 100% test coverage.

Figure 8B:
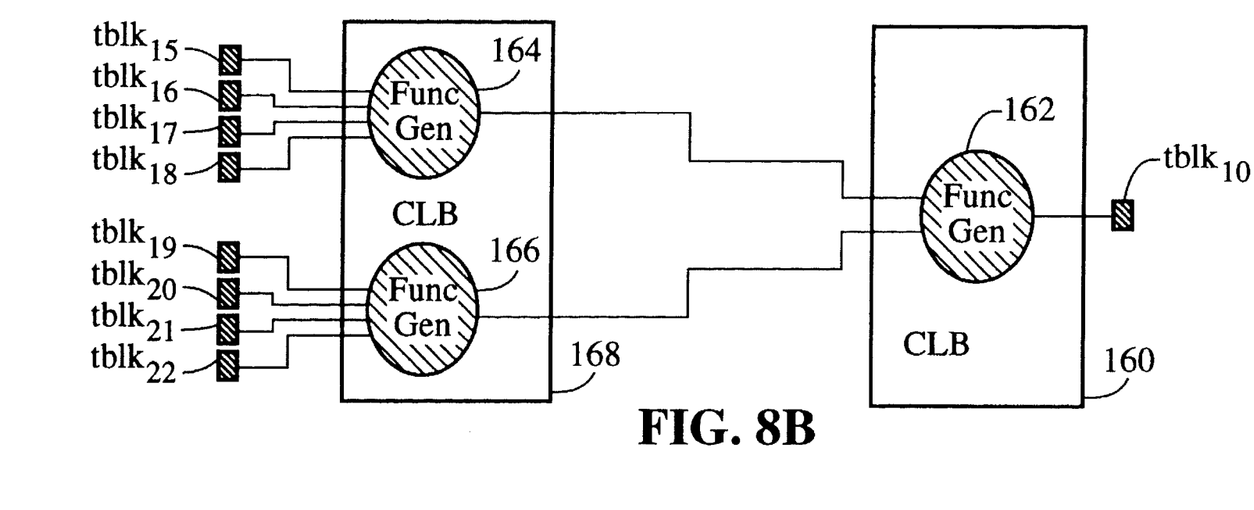

Another embodiment shown in FIG. 8b selectively eliminates some test blocks (to conserve chip surface area) from the gate array (i.e., test blocks $tblk_{12}$, $tblk_{14}$ are eliminated) because such intermediate test blocks are not needed for 100% coverage. This is because all possible combinations of intermediate terms can be provided by applying all possible combinations of test vectors to the eight inputs to function generators 164, 166, 162 at the same time. The chief limitation of applying all combinations of test vectors is test time, because the number of test vectors needed to test all combinations is $2^N$, where N is the number of inputs. It is usually possible to achieve 100% fault coverage without testing all $2^N$ combinations of signals. For example, a four-input AND gate may be fully tested using five, not sixteen test vectors: four vectors having a zero on each input in turn and ones on other inputs, and a fifth vector having all ones on the inputs. Test time is reduced by using a minimal set of test vectors which still achieve 100% fault coverage. A well-known algorithm for test generation is the standard D-algorithm described by J. P. Roth in "Diagnosis of Automata Failures: A Calculus and a Method", IBM J. Res. Develop., vol. 10, pp 278–291, July 1966.

This method of selective elimination of test blocks is not limited to gate arrays which are being substituted for FPGA's, but is generally applicable to any integrated circuit with on-chip test elements where it is possible to test two or more logical functions at one time if the logic functions are in a single logic path.

The above description is illustrative and not limiting; further modifications will be apparent to one of ordinary skill in the art in light of this disclosure and are intended to be encompassed by the appended claims.

We claim:

1. A method of making and configuring a mask-configured logic cell array configured to emulate the logical operations of a user-configured logic cell array during normal mode operations, comprising the steps of:

provi­ding a netlist describing the configuration of the user-configured logic cell array, the netlist including a plurality of logic blocks each including a plurality of logic gates present on the user-configured logic cell array; and configuring the mask-configured logic cell array according to the netlist without a logic simulation to verifying functionality of the configured mask-configured logic cell array, the mask configured logic cell array including a plurality of logic gate clusters placed and routed to correspond one-to-one to used logic blocks of the user-configured logic cell array, each cluster being a plurality of logic gates having physical proximity, but not including at least some logic gate clusters corresponding to unused logic blocks on the user configured logic cell array.

2. The method of claim 1, wherein the logic blocks each include at least one function generator and further comprising the steps of:

providing a plurality of test blocks on the mask configured logic cell array; and connecting a test block to each function generator in a logic block only if an output signal line of the function generator is directly connected externally to the logic block.

3. The method of claim 1, further comprising the step of connecting multiplexers to each of a clock and data input terminal of a plurality of flip-flops present on the mask-configured logic cell array, thereby providing a test capability for each such flip flop.

4. The method of claim 1, wherein no timing simulation of the netlist is required to ensure functionality of the mask-configured logic cell array.

5. The method of claim 1, wherein no logic simulation of the netlist is required to ensure functionality of the mask-configured logic cell array.

6. The method of claim 1, further comprising the steps of:

providing test elements in the logic cell array, the logic blocks having a plurality of logic function generators and each logic function generator being a collection of logic gates forming a look up table for implementing a specific logic function;

determining for each logic function generator if it has an output terminal connected to provide an output signal outside of the logic block of which the logic function generator is a part;

providing a test element associated with each logic function generator so connected, and not providing a test element for other logic function generators;

connecting the test element to the output terminal of the associated function generator; and connecting together a plurality of the test elements.

7. A mask-configured integrated circuit chip in its configured state to be substituted for a user-configured integrated circuit chip, the mask-configured integrated circuit chip in its configured state being pin compatible with the user configured integrated circuit chip, and comprising:

a plurality of configured mask-configured routing lines for routing signals previously routed by pass transistors and line segments of the user-configured integrated circuit chip; and a plurality of cluster groups of logic elements, each cluster group of elements corresponding to a user-configured logic block in the user-configured integrated circuit chip, wherein the functions of each logic block in the user-configured integrated circuit chip are carried out in a corresponding configured clustered group of logic elements in the mask-configured integrated circuit, each gate in each clustered group being placed and routed to have physical proximity to all other gates in the clustered group, and at least one unused logic gate in a logic block of the user-configured integrated circuit chip not being replicated in the corresponding clustered group.

8. The mask-configured integrated circuit chip of claim 7, wherein each cluster group comprises at least one function generator and further comprises a test logic block connected to an output line of the function generator only if an output line of the function generator is connected externally to the logic block.

9. The mask configured integrated circuit chip of claim 8, in which each of the cluster groups further includes a flip flop having clock and data input terminals, each clock and data input terminal being driven by a multiplexer.

10. The mask configured integrated circuit chip of claim 7, wherein the clustered groups of elements are of non-uniform physical dimensions.

11. The mask configured integrated circuit chip of claim 7, wherein the clustered groups of elements have differing numbers of logic gates one to another.

12. The mask configured integrated circuit chip of claim 8, further including an on-chip test capability comprising:

a plurality of logic function generators in the logic blocks, each logic function generator having a collection of logic gates forming a look up table for implementing a specific logic function; and a plurality of test elements, each test element being associated with one of the logic function generators which has an output terminal connected to provide an output signal outside a particular logic block, wherein each test element is connected to the output terminal of the associated logic function generator.

* * * * *